METHOD OF FABRICATING SURFACE-BARRIER DETECTORS

Filed Sept. 15, 1961

INVENTOR.
Richard J. Fox
BY
Roland A. Anderson
ATTORNEY 3,163,915

METHOD OF FABRICATING SURFACE-BARRIER DETECTORS

Richard J. Fox, Oak Ridge, Tenn., assignor to the United States of America as represented by the United States Atomic Energy Commission Filed Sept. 15, 1961, Ser. No. 138,533
2 Claims. (Cl. 29—25.3)

This invention relates to surface-barrier detectors and more particularly to a method for fabricating silicon surface-barrier detectors and the like by a process that insures uniformity and high quality, and is an improvement over the process disclosed in the prior co-pending application of James L. Blankenship, Serial No. 89,585, now abandoned.

In the above prior art case, a method of manufacture for silicon surface-barrier detectors is described and some of the uses are outlined for the resulting product. Although generally acceptable units were prepared using that method, a method was desired which would produce acceptable units more routinely and of improved geometry for specific applications such as in particle "telescopes."

Applicant with a knowledge of these problems of the prior art has for an object of his invention the provision of an improved method of making silicon surface-barrier detectors which will produce, on a routine basis, units that are uniform and have improved geometry.

Other objects and advantages of my invention will appear from the following specification and accompanying drawings and the novel features thereof will be particularly pointed out in the annexed claims.

In the drawings, FIG. 1 is an isometric, partly in section, of a detector made in accordance with my improved method;

Figure 1:
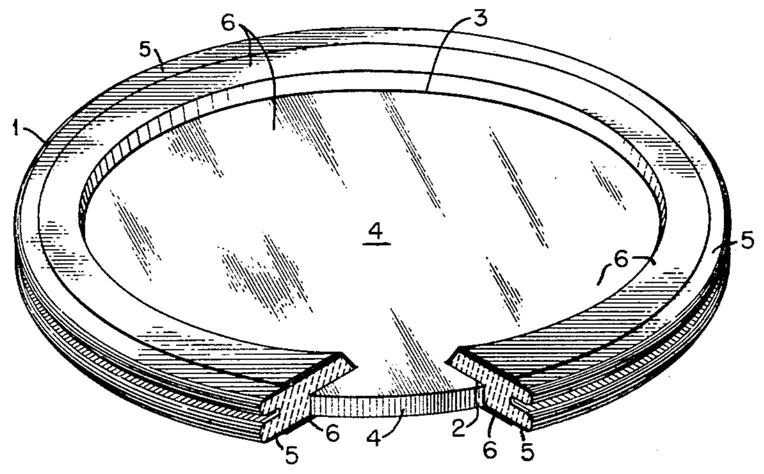

As in the prior art, thin (0.020 inch) wafers are cut from n-type silicon ingot and are machine-lapped on both sides to produce extremely smooth and parallel faces. The resultant wafers are about 0.010 inch thick. After cutting to the desired cross-sectional area, each wafer is etched on one side in a conventional etchant such as nitric, hydrofluoric, glacial acetic acids. The second side is masked by a vacuum manipulating tool such as a bulb suction cup. This etching removes about 0.003 inch of silicon and produces a clean specular surface. After a thorough rinse, the wafer is dried and then placed etch-side up on a clean surface (blotter paper). Extreme care is used to remove the wafer from the manipulating tool so that the etched surface does not come in contact with any contaminating agent.

A mounting for the wafer is prepared by machining or otherwise forming a ceramic (Type A lava) holder 1, with a coefficient of expansion which matches the silicon, having the configuration shown in the figure. After machining, the lava is fired and both faces then coated with conducting silver paint 5. The counter bore 2 of the lava ring is painted with a room-temperature curing epoxy resin such as Ciba Corporation, No. CN–502 Araldite, a diglycidyl ether of bisphenol A with ethylene diamine as a curing catalyst, and an amine type hardener, and the ring is then placed, resin side down, over the silicon wafer 4. A narrow, continuous fillet

3 of the epoxy results extending from the silicon to the silver paint.

After aging the unit approximately 24 hours to cure the epoxy and to oxidize the silicon, an electrically conductive surface of gold 6 is vapor deposited on both faces of the silicon and on the adjacent surface of the lava ring. The resulting oxide coating, which is common to surface barrier detectors, does form a dielectric layer but does not significantly interfere with current flow, since the electric field within the layer is so high that it does not behave as a dielectric. (Typically several hundred volts across perhaps 10 angstrom units of oxide.) This gold surface 6 is approximately 75 $\mu$gm./cm.$^2$. Because of the geometry of the vapor-depositing arrangement, no gold is deposited on the edge of the lava ring.

Figure 2:
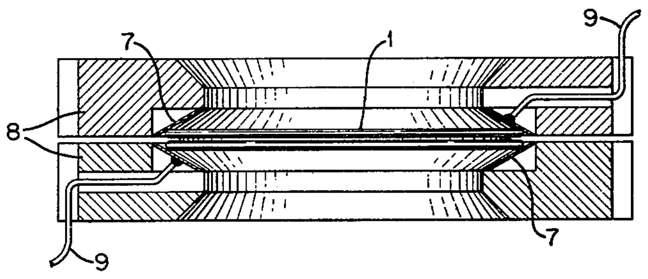
FIG. 2 is a detail of a clamping ring with Belleville washers to provide electrical contact.
Figure 3:
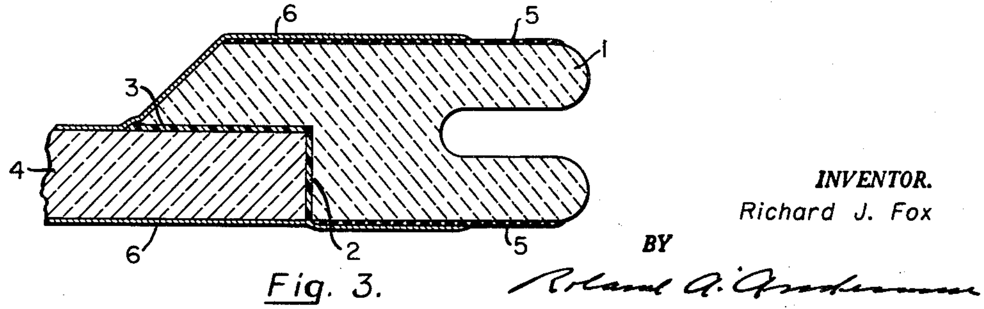
FIG. 3 is a fragmental sectional detail of the holder, crystal and coatings.

Electrical contact is made to the conductive coating of silver paint on the lava ring with compressed springs such as Belleville washers 7 of FIG. 2. A two-part clamping ring 8, maintained in assembled relation by screws (not shown), is used to provide positive contact between the washer and the gold. However, FIG. 2 shows the assembly before the parts of clamp 8 are drawn together in clamping relation. Electrical leads 9 are then secured to the washer with solder. If desired for specific applications, several such wafer units may be stacked, with intervening washers for electrical contact.

The subject development not only provides an improved method for the manufacture of these detector elements but also provides a structure of improved geometry. Specifically, there is no interfering structure on the "back" of the detector as in the prior art. Thus, the detector elements may be stacked, as described above, to study the range and $dE/dx$ of incident particles that might penetrate one or more of the detector elements. With thin wafers and proper discrimination through coincidence and anti-coincidence circuits, narrow energy bands may be studied. These units can be operated at very low temperature (77° K.) and withstand extreme thermal cycling due to proper expansion matching.

In the foregoing arrangement, very thin wafers ($\approx$1/10 mm.) can be thermally cycled to low temperatures (77° K.) without breakage.

Having thus described my invention, I claim:

1. A method of making silicon surface-barrier nuclear particle detectors comprising the steps of slicing n-type silicon crystals to a thickness of .0.10 inch to produce wafers, etching one surface of the wafer to produce a clean surface free of crystal damage, rinsing the wafer with a cleaning liquid, machining a ceramic holder to provide a wafer receiving recess, firing the holder and applying a conductive coating to the faces, coating the recess with a room temperature curing epoxy resin, mounting the wafer in the recess in contact with the resin, aging the unit to cure the epoxy and oxidize the silicon, then vapor depositing an electrical conductive surface of gold on the faces of the silicon and on the adjacent surfaces of the ceramic holder, and applying a compressed spring to the conductive coating.

2. A method for making surface-barrier nuclean particle detectors comprising the steps of slicing a semiconductor type of crystal into wafers, etching one surface of the wafer while masking the opposite surface to produce a clean secular surface, rinsing the etched surface with a cleaning liquid, drying the cleaned surface, applying a conductive coating to a wafer holder, covering the wafer receiving portions of the holder with a resin, depositing the wafer in the holder with the etched surface in contact with the resin, aging the unit to cure the resin and oxidize the crystal, and then vapor depositing an electrical conductive surface of gold on the faces of the crystal and on the adjacent surfaces of the holder.

References Cited by the Examiner

UNITED STATES PATENTS

| | | | |
|---|---|---|---|
| 2,644,852 | 7/53 | Dunlap | 136—89 |
| 2,669,663 | 2/54 | Pankove | 29—25.3 |
| 2,707,319 | 5/55 | Conrad | 29—25.3 |
| 2,786,880 | 3/57 | McKay | 136—89 |
| 2,952,896 | 9/60 | Cornelison et al. | 29—25.3 |
| 3,030,558 | 4/62 | Berg | 29—25.3 X |
| 3,050,667 | 8/62 | Emeis | 29—25.3 X |

RICHARD H. EANES, Jr., *Primary Examiner.*

LEON PEAR, WHITMORE A. WILTZ, *Examiners.*